United States Patent
Wu et al.

[11] Patent Number: 6,033,999
[45] Date of Patent: Mar. 7, 2000

[54] METHOD OF SOLVING CONTACT OBLIQUE PROBLEMS OF AN ILD LAYER USING A RAPID THERMAL ANNEAL

[75] Inventors: Jann-Ming Wu, Kaoshiung; Min-Hsiung Chiang, Taipei; Jenn Ming Huang, Hsin-Chu; Ming-Ta Lei, Hsin-Chu, all of Taiwan

[73] Assignee: Taiwan Semiconductor Manufacturing Company, Hsin-Chu, Taiwan

[21] Appl. No.: 09/020,584

[22] Filed: Feb. 2, 1998

[51] Int. Cl.$^7$ .................................................. H07L 21/283
[52] U.S. Cl. ........................ 438/789; 438/788; 438/108; 438/633
[58] Field of Search .................................. 438/788, 789, 438/108, 633

[56] References Cited

U.S. PATENT DOCUMENTS

| | | | |
|---|---|---|---|
| 5,296,411 | 3/1994 | Gardner et al. | 437/238 |
| 5,395,790 | 3/1995 | Lur | 437/69 |
| 5,618,381 | 4/1997 | Doan et al. | 438/633 |
| 5,629,240 | 5/1997 | Malladi et al. | 438/106 |
| 5,635,425 | 6/1997 | Chen | 438/631 |
| 5,899,735 | 5/1999 | Tseng | 438/592 |

*Primary Examiner*—Charles Bowers
*Assistant Examiner*—Lisa A Kilday
*Attorney, Agent, or Firm*—George O. Saile; Stephen B. Ackerman; William J. Stoffel

[57] ABSTRACT

A method of annealing an interlevel dielectric (IDL) layer 24 composed of PE-TEOS oxide before contact openings are formed in the ILD layer. The anneal prevents the contact openings 30 in IDL layer 24 from shifting and causing contact problems (contact oblique 33). The method begins by forming a first insulating layer 16 20 over a semiconductor structure 12. An ILD layer 24 composed of silicon oxide formed by a PECVD process using TEOS overlying the structure 12. In a key step, first rapid thermal anneal (RTA) is performed on the interlevel dielectric layer 24. The first RTA is preferably performed at a temperature in a range of between about 940 and 1100° C. for a time in a range of between about 10 and 120 seconds. A contact hole 30 is then formed through the first insulating layer and the interlevel dielectric layer 24. The invention's first rapid thermal anneal prevents the ILD layer 24 from shrinking and shifting that distorts the contact hole 30.

15 Claims, 1 Drawing Sheet

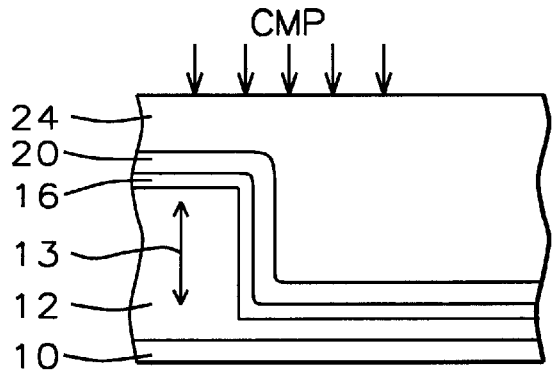
FIG. 1
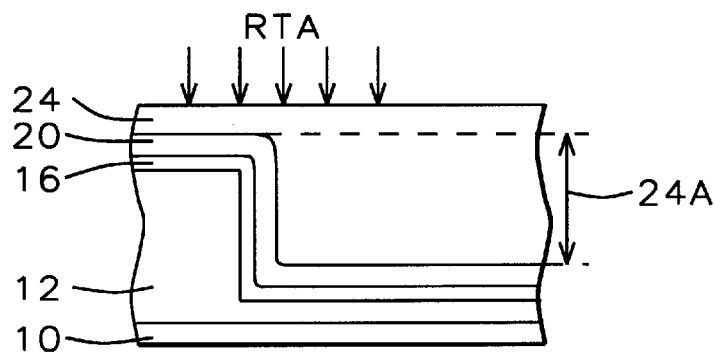
FIG. 2
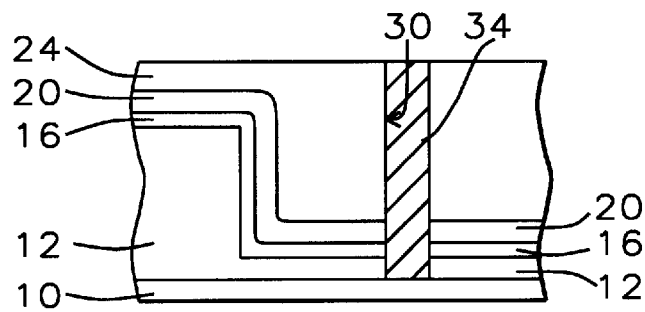
FIG. 3
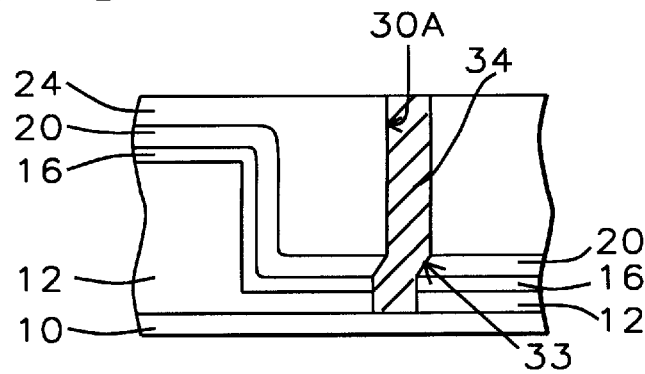
FIG. 4 – Prior Art

METHOD OF SOLVING CONTACT OBLIQUE PROBLEMS OF AN ILD LAYER USING A RAPID THERMAL ANNEAL

BACKGROUND OF INVENTION

1) Field of the Invention

This invention relates generally to the fabrication of insulating layers for semiconductor devices and particularly to methods for forming interlevel dielectric (ILD) layers having contact holes and rapid thermal anneals.

2) Description of the Prior Art

Integrated circuits are chemically and physically integrated onto a substrate, such as a silicon substrate, by patterning conductive regions in the substrate and by patterning conductive and insulation layers over the substrate. The various conductive and insulation layer create uneven surfaces on a semiconductor structure.

For high density devices of submicron size it is essential to start with a flat wafer and to maintain a flat planarized surface at various fabrication steps. If the process steps for device fabrication are performed on a semiconductor structure surface that is not uniform and planarized, various problems can occur which may result in a large number or inoperable devices.

Interlevel dielectric (ILD) layers 24 are formed between conductive layers (e.g., metal or polysilicon) in a semiconductor device or between conductive lines formed from the same conductive layer (in the same level). Contact holes are formed through the ILD layers to make electrical contact with conductive layers and device regions there below. As shown in FIG. 4, the inventor has encountered a major problem with submicron contacts and contact holes in ILD layers. FIG. 4 shows a semiconductor structure 12 (including a substrate or underlying layer 10) with the following layers overlying: insulating layers 16 (e.g., USG), 20 (e.g., BPTEOS ) and an ILD layer 24 (e.g., PETEOS), contact hole 30A and conductive contact 34. The inventor has performed various experiments and diagnostics to determine that the ILD layer 24 is shrinking and shifting thereby making the contacts skewed 33 (contact oblique problem 33). This skewing 33 of contact reduces yields and lower device reliability.

The inventor has determined that this skewing contact problem (contact oblique problem) occurs after heating (annealing) a PE-TEOS ILD layer 24 having a contact hole 30A. The contact oblique problem 33 often occurs when the PE-TEOS ILD layer 24 has a thickness gradient (e.g., as shown in FIG. 4 from the left (thin ILD layer) to the right (thicker ILD layer). The composition of the layer (e.g., 20) underlying the PE-TEOS ILD layer 24 can make the contact oblique problem worse. For example, the inventor found that an underlying layer 20 composed of BPTEOS often worsens the contact oblique problem. The thickness variations in the ILD layer 24 are commonly created by planarization processes such as chemical-mechanical polish and etch back processes.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,618,381 (Doan) shows a CMP polishing method. U.S. Pat. No. 5,395,790 (Lur) shows a method of forming trenches in the isolation area followed by an anneal which relieves the stress. U.S. Pat. No. 5,296,411 (Gardner) shows a $N_2$ anneal for a tunnel oxide. U.S. Pat. No. 5,635,425 (Chen) shows a $N_2$ Plasma treatment for a TEOS layer.

However, the problem of interlevel dielectric layers shifting and causing contact oblique problems requires a cost-effective solution.

SUMMARY OF THE INVENTION

It is an object of the present invention to provide a method for fabricating a method of manufacturing an interlevel dielectric (ILD) layer having a contact hole where the ILD layer will not shrink or shift preventing the contact oblique problem.

It is an object of the present invention to provide a method for fabricating an interlevel dielectric layer of silicon oxide using a plasma enhanced chemical vapor deposition (PECVD) process with TEOS.

To accomplish the above objectives, the present invention provides a method of manufacturing an interlevel dielectric (ILD) layer formed using TEOS having a contact hole where the ILD layer will not shrink or shift thus preventing the contact oblique problem 33. The invention forms an ILD layer of silicon oxide using a plasma enhanced chemical vapor deposition (PECVD) process with TetraEthylOrtho-Silicate (TEOS). The method of the invention rapid thermal anneals the ILD layer 24 before a contact hole is formed therein.

The method of the present invention to form an interlevel dielectric (ILD) layer; comprises:

a) forming a first insulating layer 16 20 over a semiconductor structure 12;

b) forming an interlevel dielectric (ILD) layer 24 composed of silicon oxide formed by a PECVD process using TEOS;

c) performing a first rapid thermal anneal of the interlevel dielectric layer 20; the first RTA performed at a temperature in a range of between about 940° and 1100° C. (tgt=980° C.) for a time in a range of between about 10 and 120 seconds;

d) forming a contact hole 30 through the first insulating layer and the interlevel dielectric layer 24 exposing a portion of the semiconductor 12;

e) forming a conductive contact 34 filling the contact hole;

f) performing a contact anneal of the contact at a temperature in a range of between about 880 and 940° C. (tgt=925° C.) where the ILD rapid thermal anneal is preformed at a temperature least 10° C. higher that the contact anneal, whereby the performing of the ILD rapid thermal anneal prevents the ILD layer 24 from shrinking and shifting that distorts the contact hole 30.

The present invention provides a method of preventing an ILD layer 24 from shifting and shrinking thereby preventing contact oblique problems. The invention forms a silicon oxide ILD layer using a PE-TEOS process and afterwards performs an important rapid thermal anneal (RTA) on the ILD layer before contact openings are formed in the ILD layer. The invention's ILD RTA step prevents the ILD layer 24 from shrinking and shifting from thinner to thicker regions. See FIG. 4. The prevention of the shift contact (e.g., contact oblique problem) improves yields and Rc (contact resistance).

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the appended claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 3 are cross sectional views for illustrating a method for manufacturing a an ILD layer and contact hole that prevents contact hole shifting according to the present invention.

FIG. 4 is a cross sectional view showing a contact hole where the ILD layer has shifted causing the contact oblique problem as realized by the inventor on the inventor's process.

DETAILED DESCRIPTION OF THE PREFERRED EMBODIMENTS

The present invention will be described in detail with reference to the accompanying drawings. The invention forms a silicon oxide ILD layer using a PE-TEOS process and afterwards performs a rapid thermal anneal(RTA) on the ILD layer preferably before openings are formed in the ILD layer. The invention's ILD RTA step prevents the ILD layer from shrinking and shifting from thinner to thicker regions. See FIG. 4.

The invention is summarized in the table below:

TABLE

Process Summary

Form a semiconductor structure 12 preferably having conductive lines on a
substrate 10
Form first isolation layer - USG Dep. (1K Å) - layer 16
form second isolation layer - BPTEOS DEP (2K Å) - layer 20
BPTEOS Density (@ T = 750° C.) - layer 20
form IDL layer - PETEOS DEP (10K Å) - layer 24
planarizing the IDL layer 24 - chemical-mechanical polish (CMP) or other planarization process
Post-polish clean
Key step == RTA of PETEOS oxide ILD Layer 24 at Temperature = about 980° C.
Form Contact photo and contact etch - contact opening 30 and contact plug 34
Contact RTA anneal (T @ 925° C.

The table below summarizes some key features of the process of the invention.

| Process step | Remarks |
| --- | --- |
| Form a semiconductor structure 12 preferably having conductive lines on a substrate 10 | The structure 12 has a high and low areas preferably with a height difference 13 greater than about 1000 Å. These height differences cause the IDL layer 24 to shift. |
| Form first isolation layer - USG Deposition (1K Å) - layer 16 | optional layer |

-continued

| Process step | Remarks |
| --- | --- |
| form second isolation layer 20 - BPTEOS DEP (2K Å) - layer 20 | The contact shift problem is worsened when a Boron/Phosphorous) doped layer 20 underlies the ILD layer 24. - But layer 20 can be any material |
| form IDL layer 24 - PETEOS DEP (about 10K Å) planarizing the IDL layer 24 - chemical-mechanical polish (CMP) or other planarazation process Post-polish clean | |
| Key step == RTA of PETEOS ILD Layer 24 at Temperature = about 980° C. Contact photo and contact etch and contact 34 | RTA temperature is at least 20 degrees higher than a subsequent heat cycle (e.g., contact RTA) |
| Contact RTA anneal (T @ 925° C.) or other high temperature process | The contact shift problem 33 has been caused by contact RTA Temperature as low as 880° C. This contact RTA is to anneal Silicon damage after contact etch to lower the Rc. |

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not be described in detail in order to not unnecessarily obscure the present invention.

It should be recognized that many publication describe the details of common techniques used in the fabrication process of integrate circuit component. See, E.g., C. Y. Chang, S. M. Sze, in *ULSI Technology*, by The McGraw-Hill Company, Inc. copyright 1997. Those techniques can be generally employed in the fabrication of the structure of the present invention. Moreover, the individual steps of such a process can be performed using commercially available integrate circuit fabrication machines. As specifically necessary to than understanding of the present invention, exemplary technical data are set forth based upon current technology. Future developments in the art may call for appropriate adjustments as would be obvious to one skilled in the art.

The invention's method of forming an interlevel dielectric (ILD) layer 24 using a chemical-mechanical polish process having a straight contact hole 30 begins as shown in FIG. 1. It should be noted that the ILD layer 24 can be formed between or within any conductive lines (e.g., metal and polysilicon). A semiconductor structure 12 is provided. The semiconductor structure 12 is understood to possibly include a semiconductor wafer 10, active and passive devices formed within the wafer and layers formed on the wafer surface. The term "semiconductor structure" is mean to include layers/devices formed within a semiconductor wafer and the layers overlying the wafer. The semiconductor structure can have an uneven surface with high areas and low areas. The semiconductor structure 12 can have topography height changes 13. The structure 12 preferably has a high area (left side of FIG. 1) and a low area (right side of FIG. 1). The oblique contact problem can be caused by structure 12 height differences 13 of greater than about 1000 Å and more commonly on height differences between about 1000 and 12,000 Å. The height difference can cause the IDL layer 24 to shift as the IDL layer flows from the high area into lower areas. The overlying PE-TEOS layer 24 overlies these structure height differences 13 and has thickness differences about the same (greater than 1000 Å and more commonly between 1000 and 12,000 Å. These high and low area will affect the surface topology and will influence the shifting of the overlying ILD layer.

Next, a first insulating layer 16 20 is formed over a semiconductor structure 12. The first insulating layer 16 20 is preferably is comprised of two layers, a (lower) first isolation layer 16 and a (top) second isolation layer 20. The first isolation layer 16 can be composed of PE-OX, PETEOS or Undoped Silicate Glass (USG) and is most preferably composed of USG. The first isolation layer 16 preferably has a thickness in a range of between about 500 and 2000 Å.

The second isolation layer 20 can be composed of any dielectric material. The second isolation layer 20 formed of a Boron and/or phosphate doped silicon oxide (e.g., BPSG formed by TEOS) has been shown to make the contact oblique problem worse because the BPTEOS layer soft and flows during heat cycles. Moreover, the doped oxide layer can be shifted by stress from the PETEOS IDL layer 24 caused by the thickness gradient. The second isolation layer 20 preferably has thickness in a range of between about 1000 and 6000 Å.

Next, as shown in FIG. 1,an interlevel dielectric (ILD) layer 24 (e.g., IMD, IeLD, IaLD) is formed over the first insulating layer 16 20. The ILD layer preferably has a thickness in a range of between about 6000 and 20,000 Å. The inventor found that the PE-TEOS ILD layer can have a thickness in a range of between about 6000 and 20,000 Å for the contact oblique problem 33 to occur. The ILD layer 24 can be compose of silicon oxide formed by a PE-TEOS process. Preferably the ILD layer 24 is composed of an undoped silicon oxide layer formed using a PECVD process using TEOS.

TABLE

Preferred PETEOS process for ILD layer 24

| Parameter | Low limit | High limit |
| --- | --- | --- |
| Dep. Temperature (° C.) | 300° C. | 500 |
| pressure (Torr) | 2 torr | 20 |
| TEOS flow (sccm) | 600 | 1000 |
| $O_2$ flow (sccm) | 400 | 800 |
| deposition temperature ° C. | 300 | 500 |
| ILD layer thickness | 6000 | 20,000 |

A preferred plasma TEOS oxide process performed using the AMT-PR5000 reactor (Applied Materials Corp.) and a plasma enhanced chemical vapor deposition process which flows oxygen at 400 and 800 sccm and under a pressure of about 2 to 20 torr, power of about 400 to 800 watts, electrode spacing of 100 to 400 mils, TEOS temperature of 300 to 500° C., and wafer temperature of 300 to 500° C. An increase in the electrode spacing and a reduction in pressure leads to an increase in the ion bonding and lowers the surface mobility so that most of the oxide is deposited on the horizontal rather than on the vertical surfaces.

As shown in FIGS. 1 and 2, said interlevel dielectric (ILD) layer 24 is planarized preferably using a chemical-mechanical polish process (CMP). Other planarizing process can be used, such as etching back. These planarization processes create the IDL layer 24 thickness 24A variations (by skimming off the high areas) that create the contact oblique problem 33. See FIG. 2. The oblique problem is often caused by IDL layer thickness differences 24 greater than 1000 Å and more commonly with current technology sizes, in a range of between about 1000 and 12,000 Å.

In a critical step, the ILD layer 24 is rapid thermal annealed using a First (IDL) RTA. The first RTA preferably is performed at a temperature in a range of between about 940 and 1100 (tgt −980° C.) for a time in a range of between about 10 and 120 sec. It is preferable that the first RTA is performed before the contact openings are formed in the IDL layer.

It is preferable that the ILD RTA be performed more that 20° C. above the temperature of any subsequent RTAs or high temperature processes. For example, in the process follow in the table above, the first RTA must be at least 20° C. above the contact anneal.

The RTA of the ILD layer 24 (before the subsequent contact etch) will cause the IDL layer to shrink first. After the contact patterning (opening holes in the ILD layer 24), the lower contact RTA temperature will not be capable of causing the ILD layer 24 shrinkage and second isolation layer 20 deformity. Therefore the contact pattern/hole 30 will not be oblique.

As shown in FIG. 3, a contact hole 30 is formed through the first insulating layer 16 20 and the interlevel dielectric layer 24 preferably exposing a portion of the semiconductor layer or substrate 10. The contact hole 30 can be formed by conventional photolithographic processes (regular via etch, single and dual damascene processes.

Still referring to FIG. 3, a conductive contact 34 is formed filling the contact hole 30. The conductive contact 34 is preferably composed of polysilicon, aluminum, W, or aluminum cooper alloy.

Next, the entire wafer 10 is annealed using a contact rapid thermal anneal (RTA) performed at a temperature in a range of between about 880 and 940 (tgt=925° C.). This anneal is to anneal Si 10 damage after the contact etch. This anneal is representative of any subsequent anneal. The performing the invention's ILD rapid thermal anneal prevents the ILD layer 24 from shrinking and shifting that distorts the contact hole 30 during this contact RTA or any other high temperature process.

The temperature of the contact anneal depends on the particular process settings and can be any temperature above 400° C. It is important that the invention's important ILD anneal be at least 20° C. above the temperature any subsequent anneal (e.g., contact anneal shown here in this example).

It should be well understood by one skilled in the art that by including additional process step not described in this embodiment, other types of devices can also be included on the chip. For example, other types of contact processes, such as damascene and dual damascene can be used to from the contact openings. It should also be understood that the figures depict only one contact opening and one interlevel dielectric layer out of a many of that are fabricated on the substrate.

While the invention has been particularly shown and described with reference to the preferred embodiments thereof, it will be understood by those skilled in the art that various changes in form and details may be made without departing from the spirit and scope of the invention.

What is claimed is:

1. A method of forming an interlevel dielectric (ILD) layer using TEOS over an uneven surface having a straight contact hole comprising:

a) providing a semiconductor structure over said substrate; said semiconductor structure has an uneven surface with high areas and low areas;

b) forming a first insulating layer over said semiconductor structure;

c) forming an interlevel dielectric layer composed of silicon oxide formed by a plasma enhanced chemical vapor deposition process using TetraEthylOrthoSilicate;

d) planarizing said interlevel dielectric layer;

e) performing a first rapid thermal anneal of said interlevel dielectric layer before a contact hole is formed in said interlevel dielectric layer wherein the first rapid thermal anneal prevents the interlevel dielectric layer from shifting and;

f) forming a contact hole through said first insulating layer and said interlevel dielectric layer exposing a portion of said substrate.

2. The method of claim 1 which further includes:

forming a conductive contact filling said contact hole;

b) in a contact anneal step, annealing said substrate at a temperature in a range of between about 880 and 940° C. whereby the first rapid thermal anneal prevents said interlevel dielectric layer from shrinking and shifting that distorts said contact hole.

3. The method of claim 1 wherein said first insulating layer is comprised of a first isolation layer composed of borophosphosilicate glass formed by a TEOS process, said first isolation layer having thickness in a range of between about 1000 and 6000 Å.

4. The method of claim 1 wherein said semiconductor structure has an uneven surface with high areas and low areas with a height difference in a range of between about 1000 and 12,000 Å.

5. The method of claim 1 wherein before the planarization step (d) said interlevel dielectric layer has maximum thickness in a range of between about 6000 and 20,000 Å.

6. The method of claim 1 wherein the planarizing of said interlevel dielectric layer is performed using a chemical-mechanical polishing process.

7. The method of claim 1 wherein said first rapid thermal anneal performed at a temperature in a range of between about 940 and 1100°C. for a time in a range of between about 10 and 120 seconds.

8. A method of forming an interlevel dielectric (ILD) layer using TEOS over an uneven surface having a straight contact hole comprising:

a) providing a semiconductor structure over a substrate; said semiconductor structure has an uneven surface with high areas and low areas;

b) forming a first insulating layer over said semiconductor structure; forming an interlevel dielectric layer composed of silicon oxide formed by a plasma enhanced chemical vapor deposition process using TetraEthylOrthoSilicate;

c) chemical-mechanical polishing said interlevel dielectric layer;

d) performing a first rapid thermal anneal of said interlevel dielectric layer; said first rapid thermal anneal performed at a temperature in a range of between about 940 and 1100°C. for a time in a range of between about 10 and 120 sec and;

e) forming a contact hole through said first insulating layer and said interlevel dielectric layer exposing a portion of said substrate.

9. The method of claim 8 which further includes:

a) forming a conductive contact filling said contact hole;

b) annealing said substrate at a temperature in a range of between about 880 and 940° C. whereby said first rapid thermal anneal prevents said interlevel dielectric layer from shrinking and shifting that distorts said contact hole.

10. The method of claim 8 wherein said first insulating layer is comprised of a first isolation layer composed of borophosphosilicate glass formed by a TEOS process, said first isolation layer having thickness in a range of between about 1000 and 6000 Å.

11. The method of claim 8 wherein said interlevel dielectric layer has thickness in a range of between about 6000 and 12,000 Å.

12. A method of forming an interlevel dielectric (ILD) layer using TEOS over an uneven surface having a straight contact hole comprising:

a) providing a semiconductor structure over a substrate; said semiconductor structure has an uneven surface with high areas and low areas;

b) forming a first insulating layer over a semiconductor structure; said first insulating layer is comprised of a first isolation layer composed of borophosphosilicate glass formed by a TEOS process, said first isolation layer having thickness in a range of between about 1000 and 6000 Å;

c) forming an interlevel dielectric layer composed of silicon oxide formed by a plasma enhanced chemical vapor deposition process using TetraEthylOrthoSilicate; said interlevel dielectric layer has thickness in a range of between about 6000 and 12,000 Å;

d) chemical-mechanical polishing said interlevel dielectric layer;

e) performing a first rapid thermal anneal of said interlevel dielectric layer; said first rapid thermal anneal performed at a temperature in a range of between about 940 and 1100° C. for a time in a range of between about 10 and 120 sec; and f) forming a contact hole through said first insulating layer and said interlevel dielectric layer exposing a portion of said semiconductor.

13. The method of claim 12 which further includes:

a) forming a conductive contact filling said contact hole; and b) annealing said substrate at a temperature in a range of between about 880 and 940° C. whereby said first rapid thermal anneal prevents said interlevel dielectric layer from shrinking and shifting that distorts said contact hole.

14. The method of claim 1 which further includes:

a) forming a conductive contact filling said contact hole; and b) in a contact anneal step, annealing said substrate.

15. The method of claim 1 which further includes:

a) forming a conductive contact filling said contact hole; and b) in a contact anneal step, annealing said substrate at a temperature at least 20 degrees C. higher than the temperature of said first rapid thermal anneal of said interlevel dielectric layer.

* * * * *